United States Patent
Bugli et al.

(10) Patent No.: US 6,778,864 B1
(45) Date of Patent: Aug. 17, 2004

(54) SYSTEM AND METHOD FOR ANALYZING A COMPONENT

(75) Inventors: Neville Jimmy Bugli, Novi, MI (US);
Shao-Chiung Lu, Canton, MI (US);
Girish Kunjur, Southgate, MI (US);
Jhun-Sou Lin, Novi, MI (US)

(73) Assignee: Visteon Global Technologies, Inc., Dearborn, MI (US)

( * ) Notice: Subject to any disclaimer, the term of this patent is extended or adjusted under 35 U.S.C. 154(b) by 686 days.

(21) Appl. No.: 09/656,387

(22) Filed: Sep. 6, 2000

(51) Int. Cl.$^7$ ............................................. G05B 13/02
(52) U.S. Cl. ........................ 700/32; 700/30; 700/33; 700/17; 700/83; 700/96; 700/97; 703/2; 703/1; 702/182
(58) Field of Search ..................... 703/1, 2; 700/29, 700/30, 32, 33, 79, 80, 96, 97, 17, 83; 702/182–186

(56) References Cited

U.S. PATENT DOCUMENTS

| | | | |
|---|---|---|---|
| 5,107,441 A | * | 4/1992 | Decker ........................ 702/47 |
| 5,699,440 A | * | 12/1997 | Carmeli ....................... 382/100 |
| 5,949,989 A | | 9/1999 | Falkowski et al. |
| 6,056,428 A | * | 5/2000 | Devoino et al. ................ 703/2 |
| 6,334,100 B1 | * | 12/2001 | Ahrikencheikh et al. ...... 703/14 |
| 6,393,331 B1 | * | 5/2002 | Chetta et al. .................. 700/97 |
| 6,434,441 B1 | * | 8/2002 | Beauchamp et al. .......... 700/98 |
| 6,477,517 B1 | * | 11/2002 | Limaiem et al. .............. 706/45 |
| 6,560,569 B1 | * | 5/2003 | Abu El Ata ................... 703/2 |
| 6,587,741 B1 | * | 7/2003 | Chetta et al. .................. 700/97 |
| 6,721,606 B1 | * | 4/2004 | Kaji et al. ..................... 700/17 |

* cited by examiner

Primary Examiner—Anthony Knight
Assistant Examiner—Crystal J. Barnes

(57) ABSTRACT

A system 10 for analyzing a component such as an air filter. System 10 may be created by and/or comprise software which resides within a conventional computer aided engineering ("CAE") system. The system 10 utilizes a CAE model 12 to analyze the functionality or performance of an air filter based on certain attributes of the filter, such as the size, shape and media of the filter, and/or to determine certain attributes of the filter, such as the size of the filter, based on certain desired performance requirements of the filter.

9 Claims, 3 Drawing Sheets

SYSTEM AND METHOD FOR ANALYZING A COMPONENT

FIELD OF THE INVENTION

This invention relates to a system and method for analyzing a component and more particularly, to a system and method which automatically determines the performance of a component, such as an air filter, given certain attributes of the component and/or which determines an attribute of a component given certain desired performance criteria of the component.

BACKGROUND OF THE INVENTION

Computer aided engineering systems, commonly referred to as "CAE systems", are used to design and analyze components, such as automotive air filters. CAE systems typically include a user interface or terminal which operates under stored program control and which selectively allows a user to generate, view and modify a computer model of a component and to determine and/or estimate the performance of the component model.

While the foregoing CAE analysis method is effective to accurately analyze and determine the functionality of various components, such as automotive air filters, it suffers from some drawbacks. For example and without limitation, creating or building a proposed model for a component such as an air filter is generally time consuming and tedious. Additionally, component models must be created and modified repeatedly during the design and development process until a model is generated that meets performance and size requirements. In each case, a user must typically begin the model creation process anew. As a result, each time an alteration or modification is made within the air filter or component, an entirely new model is typically constructed or programmed. This undesirably increases the time and expense required to design and develop complex components such as air filters, thereby decreasing the efficiency and flexibility of the development process. Moreover, prior systems and methods do not provide users with suggestions or estimates as to the appropriate size or shape of an air filter or an air filtration system that would meet certain performance requirements. Hence, a user must often guess as to what modifications will cause the filter to meet the performance requirements. As a result, the time required to achieve a component model that meets performance requirements is undesirably increased.

There is therefore a need to provide a system for analyzing components which overcomes at least some of the various and previously delineated drawbacks of prior systems, and which provides for the relatively simple development and analysis of components.

SUMMARY OF THE INVENTION

It is a first object of the invention to provide a system and method for analyzing a component which overcomes at least some of the previously delineated drawbacks of prior systems.

It is a second object of the invention to provide a system and method for analyzing the functionality of a component given certain attributes of the component and/or for determining an attribute of a component given certain performance requirements for the component.

It is a third object of the invention to provide a system and method for analyzing an air filter which utilizes a CAE model to determine the size of an air filter, based on certain performance requirements of the air filter, and to determine the performance of an air filter, based upon certain attributes of the filter.

According to a first aspect of the present invention, a system is provided for analyzing a component. The system includes a user interface which allows a user to selectively enter performance values corresponding to certain performance parameters of the component and to enter attribute values corresponding to certain attributes of the component; and a computer aided engineering model which includes normalized data which relates the certain performance parameters to the certain attributes of the component, the computer aided engineering model being effective to receive the user entered values, to calculate estimated performance parameters based upon entered attribute values, and to calculate estimated attribute values based upon entered performance values.

According to a second aspect of the present invention, a method is provided for analyzing a component. The method includes the steps of providing a computer system with a user interface; providing a computer aided engineering model including certain normalized component data which is stored within the computer system; inputting certain component attribute values into the computer aided engineering model; and calculating certain performance values based on the inputted certain component attribute values and the certain normalized component data.

According to a third aspect of the present invention, a method for analyzing an air filter is provided. The method includes the steps of providing a computer system with a user interface; providing a computer aided engineering model including certain normalized air filter data which is stored within the computer system; inputting hard rules and equations into the computer aided engineering model; selectively inputting certain air filter attribute values into the computer aided engineering model; calculating air filter performance results based on the inputted certain air filter attribute values and the certain normalized air filter data; selectively inputting certain air filter performance values into the computer aided engineering model; calculating air filter attribute results based on the inputted certain air filter performance values and the certain normalized air filter data; comparing the hard rules and equations to the calculated results; and displaying a warning flag if the comparison determines that any of the calculated results do not satisfy the hard rules and equations.

These and other objects, aspects, features, and advantages of the present invention will become apparent from a consideration of the following specification and the attached drawings.

DETAILED DESCRIPTION OF THE PREFERRED EMBODIMENT OF THE INVENTION

Figure 1:
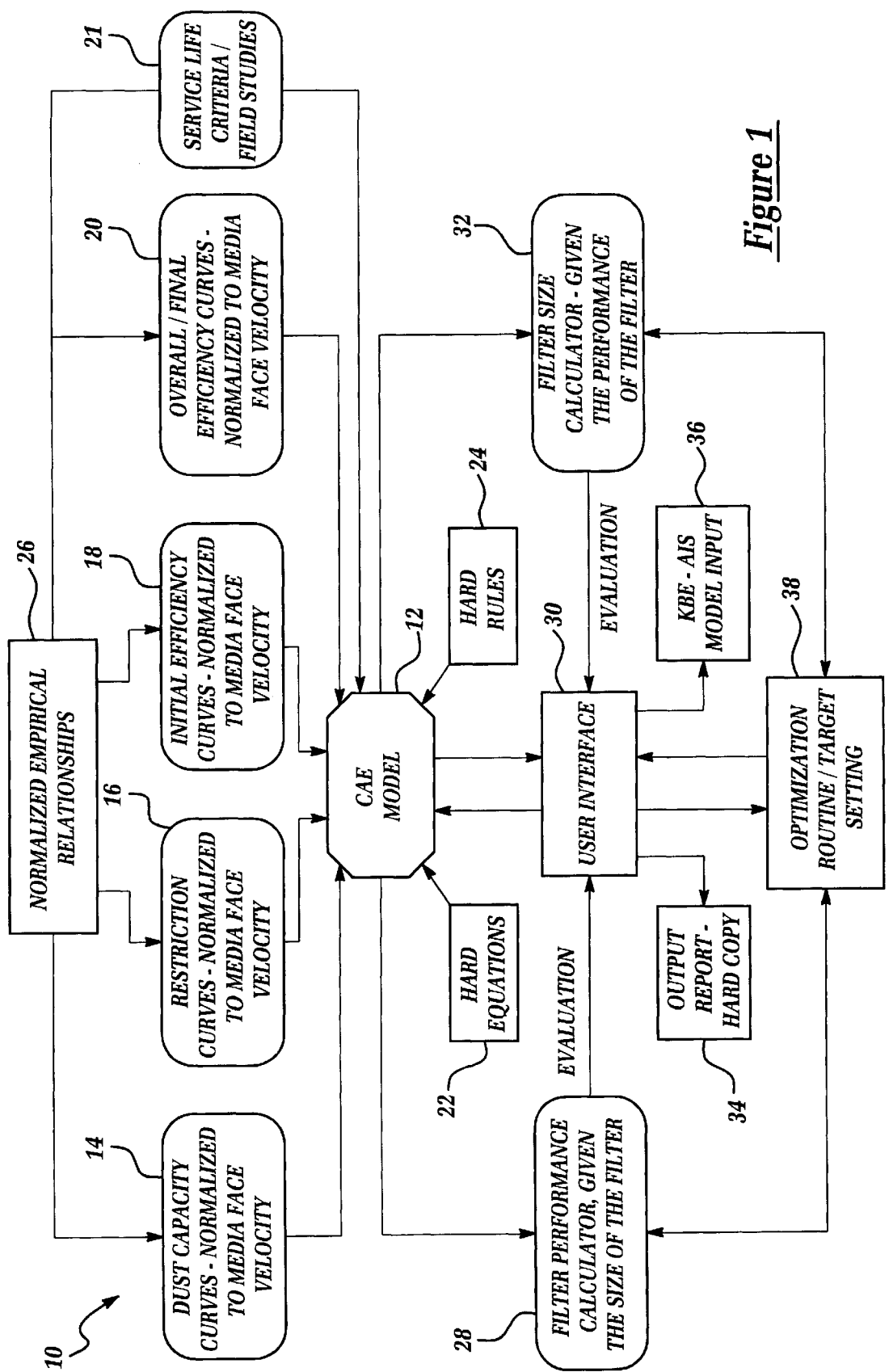
FIG. 1 is an operational flow diagram of a system for analyzing a component which is made in accordance with the teachings of the preferred embodiment of the present invention.

Referring now to FIG. 1, there is shown a component analysis system 10 which is made according to the teachings of the preferred embodiment of the present invention. In the preferred embodiment of the invention, the system 10 is used to analyze a conventional vehicular air filter assembly, such as the assembly 40, shown in FIG. 2.

In the preferred embodiment, system 10 may be created by and/or constitute or comprise software which resides within a conventional computer aided engineering ("CAE") system. Alternatively, system 10 may operatively reside within one or more unique computer platforms or processors which are operatively coupled to a CAE system which creates the CAE model 12.

In order to more fully understand the operation of system 10, the following discussion will delineate the various aspects of one type of selectively designed and analyzed component (i.e., vehicular air filter 40) to which system 10 may be applied. Air filter 40 is typically designed in accordance with certain performance and size criteria. While the use of system 10 is discussed herein with respect to the analysis of a vehicular air filter, it should be realized that in other alternate embodiments, system 10 can be used to analyze other various components, structures or objects, such as other types and/or shapes of filters (e.g., fluid filters, and/or round, cylindrical, and conical filters).

Figure 2:
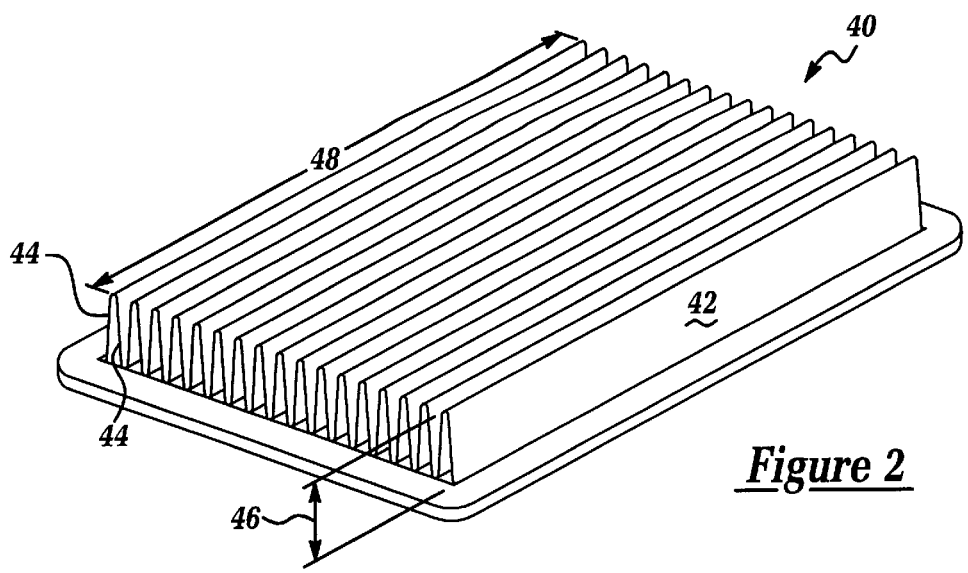
FIG. 2 is a perspective view of one type of a vehicular air filter which may be designed and analyzed according to the teachings of the preferred embodiment of the invention.

As shown best in FIG. 2, vehicular air filter 40 is a conventional "panel" type air filter. Air filter 40 is manufactured from a certain media 42 (e.g., filter paper) and includes several pleats 44 having a pleat "height" or "depth" 46 and a length 48. Air filter 40 may also comprise a conical, cylindrical or round type air filter. The performance of air filter 40 is dependent on the size and shape of filter 40 as well as the type of media 42 used to manufacture filter 40.

The present system 10 utilizes a CAE model 12 to analyze the functionality or performance of filter 40 based on certain attributes of the filter 40, such as the size, shape and media of the filter 40, and/or to determine certain attributes of the filter 40, such as the size of the filter 40, based on certain desired performance requirements of the filter 40.

As shown best in FIG. 1, system 10 includes a variety of information relating to the functionality, structure and performance of air filters which is entered into and stored within the CAE model 12 (e.g., within one or more relational databases resident within CAE model 12). This information includes performance data 14, 16, 18, and 20, which is obtained in a conventional manner, such as by testing various types of air filters and air filter media and by the use of conventional normalized empirical relationships 26. Data 14–20 includes various normalized curves or relationships that are based upon experimental data and the normalized empirical relationships 26 which yield various "points" or values that are graphically plotted. Conventional interpolation algorithms are used to "connect" the various points, thereby forming the respective curves.

Figure 3:
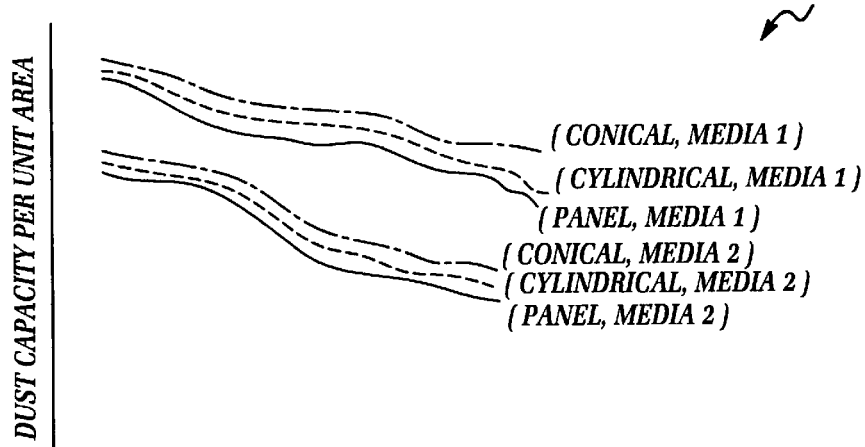
FIG. 3 is a graph illustrating an example of the relationship between the dust capacity and face velocity of a filter.

Data 14 includes various dust capacity curves or relationships which are normalized to the "face velocity" of the media of the air filter. The "dust capacity" of an air filter refers to the amount (e.g. mass) of dust the filter is capable of holding during its functional life. The "face velocity" refers to the airflow divided by the total area of the filter media, which in the preferred embodiment may be calculated by multiplying the number of pleats by the pleat height and length. In the preferred embodiment, the data 14 is arranged in various graphs or curves that can be used to predict the dust capacity of a filter based on the face velocity of that filter (e.g., the size of the filter given the airflow) or to estimate the size of the filter given the dust capacity, media and type of the filter (e.g., by calculating the face velocity of the filter). Several non-limiting examples of these curves are shown in graph 50 of FIG. 3. As shown in graph 50, different relationships or curves exist based on the type of air filter (e.g., panel, conical or cylindrical) and based upon the type of media used to create the filter (e.g., the type of filter paper, foam or other media used). It should be appreciated that additional relationships or curves may be derived which are based on other variables, such as the type of dust used to determine the capacity of the filter.

Figure 4:
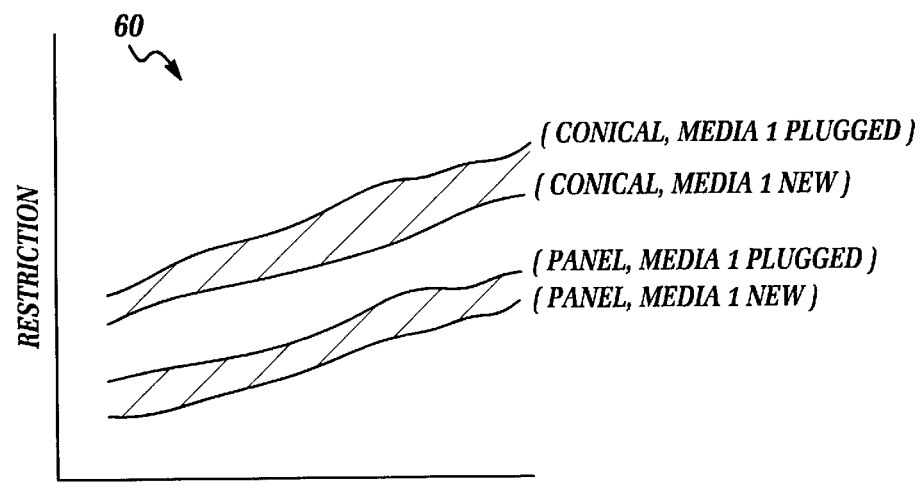
FIG. 4 is a graph illustrating an example of the relationship between the restriction and face velocity of a filter.
Figure 7:
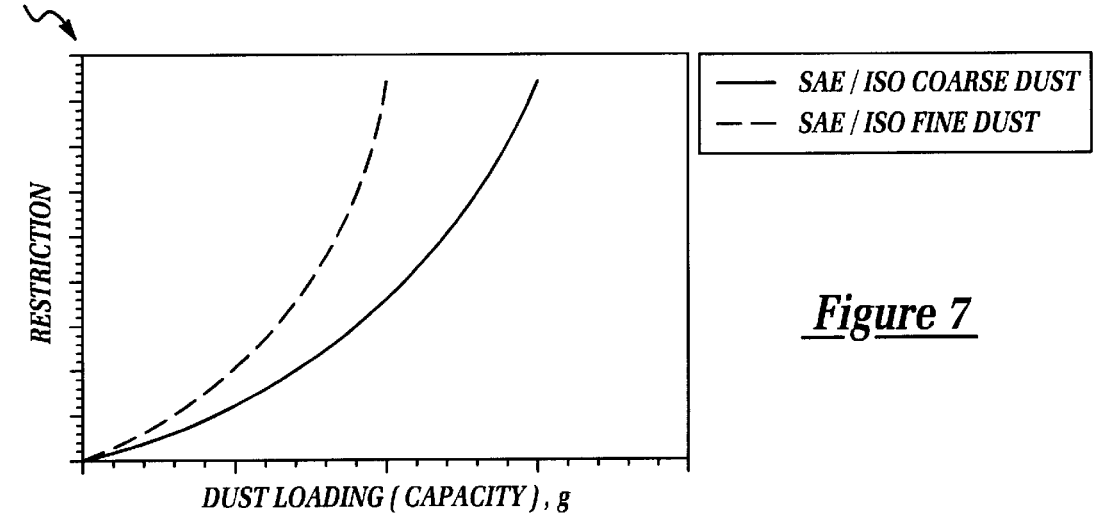
FIG. 7 is a graph illustrating an example of the relationship between the restriction and dust capacity of a filter.

Data 16 includes various restriction curves or relationships which are normalized to the "face velocity" of the media of the air filter. The "restriction" of an air filter refers to the amount that that the filter obstructs airflow. In the preferred embodiment, the restriction is measured or quantified as a pressure drop (i.e., delta pressure) across the filter. In the preferred embodiment, the data 16 is arranged in various relationships or curves that can be used to predict the restriction of a particular type of filter based on the face velocity of that filter (e.g., the size of the filter given the airflow) and the service age or "cleanliness" of the filter (e.g., the more "plugged" or dirty a filter becomes the greater its restriction) Particularly, each filter has a particular range of values which vary from a lowest restriction value or set of values when the filter is "new" or "clean" to a highest value or set of values when the filter is at the end of its service life or "plugged". These relationships may also be used to estimate the service life of the filter given the restriction and dust loading characteristics of the filter. Several non-limiting examples of these curves or ranges are shown in graph 60 of FIG. 4. As shown in graph 60, different curve ranges exist based on the type of air filter (e.g., panel, conical or cylindrical) and based upon the type of media used to create the filter (e.g., the type of filter paper or other media used). Graph 90 of FIG. 7 illustrates the relationship between the dust loading capacity of a filter versus the restriction of the filter.

Figure 5:
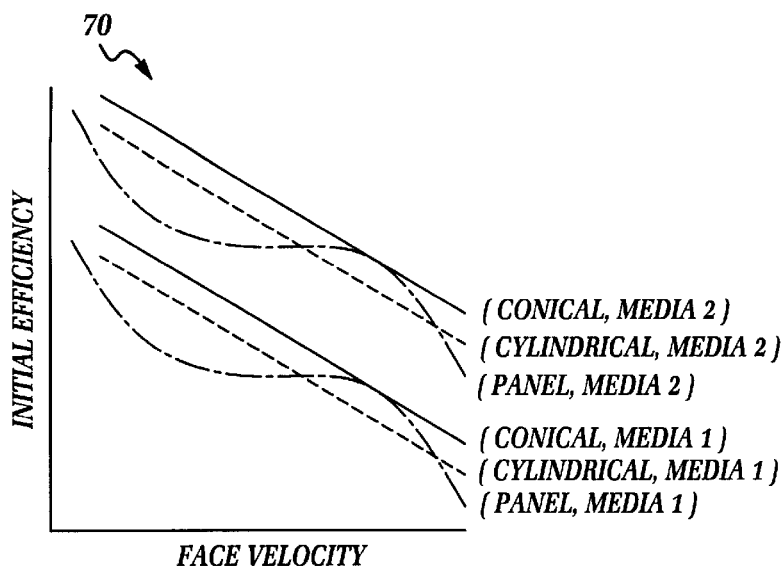
FIG. 5 is a graph illustrating an example of the relationship between the initial efficiency and face velocity of a filter.

Data 18 includes various initial efficiency curves or relationships which are normalized to the "face velocity" of the media of the air filter. The "initial efficiency" is a measure of the filter's initial ability to capture dust (i.e., the ability of the filter to capture dust when it is "clean" or new). The initial efficiency is typically measured or quantified by passing a certain amount of air and dust through the filter and determining the ratio of the amount of dust captured by a filter versus the amount of dust that enters the filter (e.g., dust captured/dust entered). In the preferred embodiment, the data 18 is arranged in various graphs or curves that can be used to predict the initial efficiency of a filter based on the face velocity of that filter (e.g., the size of the filter given the airflow), or to estimate the size of the filter given the initial efficiency, media and type of the filter (e.g., by calculating or referencing the face velocity of the filter). Several non-limiting examples of these curves are shown in graph 70 of FIG. 5. As shown in graph 70, different relationships or curves exist based on the type of air filter (e.g., panel, conical or cylindrical) and based upon the type of media used to create the filter (e.g., the type of filter paper or other media used).

Figure 6:
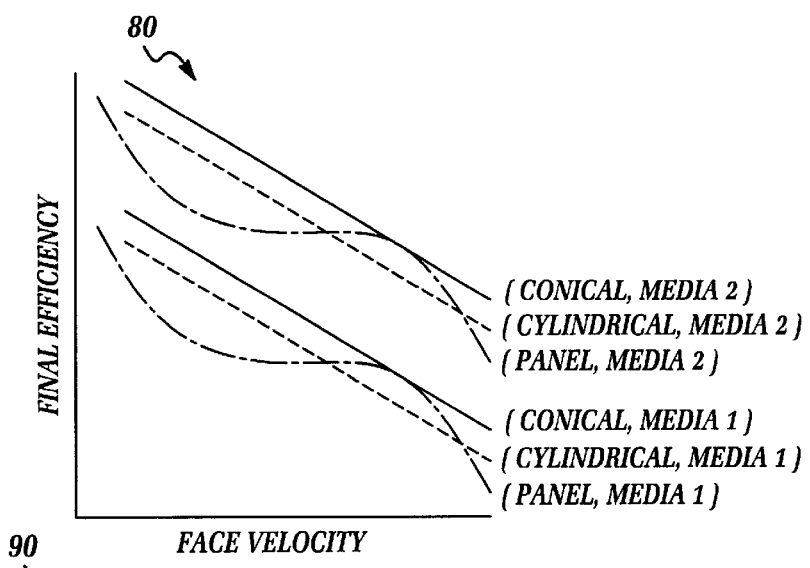
FIG. 6 is a graph illustrating an example of the relationship between the overall efficiency and face velocity of a filter.

Data 20 includes various overall or final efficiency curves or relationships which are normalized to the "face velocity" of the media of the air filter. The "overall/final efficiency" is a measure of the filter's ability to capture dust when it is fully plugged (i.e., the ability of the filter to capture dust when it is at the end of its service life). The overall or final efficiency is measured in a manner substantially identical to the initial mass efficiency. In the preferred embodiment, the data 20 is arranged in various graphs or curves that can be used to predict the overall efficiency of a filter based on the face velocity of that filter (e.g., the size of the filter given the airflow), or to estimate the size of the filter given the initial efficiency, media and type of the filter (e.g., by calculating or referencing the face velocity of the filter). Several non-limiting examples of these curves are shown in graph 80 of FIG. 6. As shown in graph 80, different relationships or curves exist based on the type of air filter (e.g., panel, conical or cylindrical) and based upon the type of media used to create the filter (e.g., the type of filter paper or other media used).

System 10 further includes other information relating to the functionality, structure and performance of air filters which is entered into and stored within the CAE model 12 (e.g., within one or more relational databases resident within CAE model 12). Particularly, system 10 includes "actual use" and/or service life data 21, which is obtained from actual field testing, warranty data and actual use of different air filters in different road environments and driving conditions. Data 21 includes information relevant to the service life of air filters and may also be arranged in various normalized curves or relationships that are based upon the data and the normalized empirical relationships 26 which yield various "points" or values that are graphically plotted.

It should be appreciated that data 14–20 and data 21 may include additional relationships or curves which may be derived from other test data, use data and variables, such as the type of dust used to test the filter.

System 10 further includes hard equations 22 and hard rules 24 which are also entered into the CAE model 12. Hard equations 22 and rules 24 include information that has been obtained from a variety of sources or experts and that limits the available dimensions and/or attributes of a filter based upon physical constraints, manufacturing limitations, existing tooling, vehicle packaging requirements, and other criteria. Hard equations 22 represent equalities that must each be satisfied by the proposed air filter, and hard rules 24 represent inequalities that must each be satisfied by the proposed air filter.

System 10 further includes a conventional user interface or input device 30 (e.g., a keyboard, mouse, display, disk drive, modem and/or other data inputting device). In the preferred embodiment, air filter parameters or variables may be selectively entered and modified by a user through interface 30. User interface 30 further allows a user to select from various system functions, such as those shown in blocks 28, 32, 34, 36 and 38, which allow a user to analyze the performance of the proposed air filter, calculate a size of the filter, optimize the filter design and to perform other system functions.

Block 28 represents a "filter performance calculator" or performance determining function, which allows a user to enter attributes of a proposed filter (e.g., size attributes) into the CAE model 12 and receive estimated performance parameters for the filter. Particularly, a user can enter the proposed dimensions of the filter, the type or shape of the filter (e.g., panel, conical or cylindrical), and the type of filter media or paper used into the CAE model 12. The CAE model 12 utilizes the user entered information along with the hard rules 24 and hard equations 22 to reference the stored data 14–21 and to provide estimated performance parameters for the proposed air filter. For example and without limitation, the CAE model 12 will automatically generate the estimated dust capacity, restriction, initial efficiency and overall/final efficiency of the proposed filter and display the resulting performance data by use of interface 30. In one non-limiting embodiment, CAE model 12 further provides an estimated service life of the filter (e.g., in total miles) by dividing the estimated total dust capacity by an "expected" amount of dust encountered per thousand miles. The "expected dust encountered" value can be entered by the user or stored as a programmable default value based upon the type or model of the vehicle and the environment in which the vehicle is to be primarily in use (e.g., off-road, urban).

In the preferred embodiment of the invention, the resulting calculated performance parameters are displayed to a user by use of interface 30. A user may then alter or modify the attributes of the proposed filter (e.g., the size, filter type, and/or media type) in an attempt to improve the filter's performance parameters and/or to achieve certain target performance requirements. This optimization function is shown in block 38. A user is also presented with a series of design options and/or curves which allow a user to predict the effect (if any) that modifications of the filter attributes, such as the pleat height, will have on performance characteristics. The curves may be arranged in one of several user selected formats and illustrate the effect of altering a specific user selected attribute (e.g., pleat height) on a user-selected performance characteristic (e.g., overall efficiency) for the filter. The resulting filter attributes and parameters are compared to the hard equations 22 and rules 24 to determine whether any design constraints or limitations have been violated. If any of the modifications cause the proposed filter to violate any of hard rules 24 or hard equations 22, system 10 will notify the user in a conventional manner by displaying a conventional warning flag or icon. Once the user has entered the proposed modifications, the performance of the modified filter is recalculated by block 28, and the system 10 displays the new performance parameter values to the user. This modification can then be repeated until desirable and/or satisfactory performance parameter values are achieved.

Block 32 represents a "filter size calculator" or size calculating function, which allows a user to enter desired performance parameter values for a filter and to receive an estimated size of the filter that would be required to provide the desired performance parameter values. Particularly, a user enters the desired or target performance parameters of the filter and the type of the filter (e.g., panel, conical or cylindrical) and/or filter media into the CAE model 12. The CAE model 12 utilizes the entered user information along with the hard rules 24 and hard equations 22 and any applicable default values to reference the stored data 14–21 and to provide an estimated size (i.e., dimensions) for the filter. For example and without limitation, the CAE model 12 will output the size of the filter and/or the values of the pleat height 46, pleat number and pleat length 48.

In the preferred embodiment of the invention, the resulting estimated dimensions or size is displayed to a user by use of interface 30. A user may then alter or modify the attributes of the proposed filter (e.g., the size, filter type, and/or media type) in an attempt to improve the filter's performance parameters and/or to alter the shape or size of the filter. This optimization function is shown in block 38. The resulting filter attributes and parameters are compared to the hard equations 22 and rules 24 to determine whether any design constraints or limitations have been violated. If any of the modifications cause the proposed filter to violate any of hard rules 24 or hard equations 22, system 10 will notify the user in a conventional manner by displaying a conventional warning flag or icon. Once the user has entered the proposed modifications, the performance of the modified filter may be recalculated by block 28, and the system 10 displays the new performance parameter values to the user. Alter natively, the desired performance parameters of the filter may be altered and a new size for the filter can be recalculated by block 32. This modification can then be repeated until desirable and/or satisfactory performance parameter and/or size values are achieved.

In block 34, a user can automatically print a report regarding the proposed filter. In the preferred embodiment, the report will contain the type, dimensions and other attributes of the proposed filter and the corresponding estimated performance parameters and design curves of the filter. In one non-limiting embodiment, the system 10 generates a graphical representation or design of the proposed filter, which is printed or displayed as one or more images in the hardcopy report. Finally, in block 36, a user may also export the proposed filter design or model into a comprehensive vehicular air induction system model or into other hardware or software platforms and models.

It should be appreciated that the foregoing system 10 provides for the automatic and accurate functional analysis of vehicular air filters. Importantly, system 10 allows filter designs to be altered and functionally analyzed without requiring an entirely new model to be constructed or programmed. This decreases the time and expense required to design and develop air filters, thereby increasing the efficiency and flexibility of the development process. Moreover, system 10 provides users with estimates as to the appropriate size or shape of an air filter that would meet certain performance requirements. As a result, the time required to develop a air filter that meets performance requirements is substantially decreased.

It is to be understood that the present invention is not limited to the exact construction or method which has been previously delineated, but that various changes and modifications may be made without departing from the spirit and scope of the invention as are more fully delineated in the following claims.

What is claimed is:

1. A system for analyzing a component, said system comprising:

a user interface which allows a user to selectively enter performance values corresponding to certain performance parameters of said component and to enter attribute values corresponding to certain attributes of said component; and a computer aided engineering model which includes normalized data which relates said certain performance parameters to said certain attributes of said component, said computer aided engineering model being effective to receive said user entered values, to calculate estimated performance parameters based upon entered attribute values, and to calculate estimated attribute values based upon entered performance values, wherein said component comprises a vehicular air filter, wherein said certain attributes comprise a filter size, wherein said certain attributes further comprise a filter type, wherein said certain attributes further comprise a filter media type, wherein said estimated performance parameters comprise a dust capacity parameter.

2. The system of claim 1 wherein said estimated performance parameters further comprise a restriction parameter.

3. The system of claim 2 wherein said estimated performance parameters further comprise an initial efficiency parameter.

4. The system of claim 3 wherein said estimated performance parameters further comprise a final efficiency parameter.

5. A method for analyzing a component comprising the steps of:

providing a computer system with a user interface;

providing a computer aided engineering model including certain normalized component data which is stored within said computer system;

inputting certain component attribute values into said computer aided engineering model; and calculating certain performance values based on said inputted certain component attribute values and said certain normalized component data, wherein said component comprises an air filter, wherein said certain normalized component data comprises dust capacity curves which are normalized to a face velocity of said air filter.

6. The method of claim 5 wherein said certain normalized component data further comprises restriction curves which are normalized to a face velocity of said air filter.

7. The method of claim 6 wherein said certain normalized component data further comprises initial efficiency curves which are normalized to a face velocity of said air filter.

8. The method of claim 7 wherein said certain normalized component data further comprises final efficiency curves which are normalized to a face velocity of said air filter.

9. The method of claim 8 wherein said certain normalized component data further comprises normalized service life criteria curves.

* * * * *